United States Patent
Purtell et al.

(10) Patent No.: US 7,504,336 B2
(45) Date of Patent: Mar. 17, 2009

(54) METHODS FOR FORMING CMOS DEVICES WITH INTRINSICALLY STRESSED METAL SILICIDE LAYERS

(75) Inventors: Robert J. Purtell, Mohegan Lake, NY (US); Henry K. Utomo, Newburgh, NY (US); Yun-Yu Wang, Poughquag, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 11/419,300

(22) Filed: May 19, 2006

(65) Prior Publication Data

US 2007/0269970 A1  Nov. 22, 2007

(51) Int. Cl.
  *H01L 21/44* (2006.01)
(52) U.S. Cl. .................. 438/682; 438/683; 438/655; 438/E21.165; 438/E21.438
(58) Field of Classification Search .......... 438/586, 438/592–595, 600–669, 682–683, 655; 257/E21.165, 257/E21.438, E21.576
See application file for complete search history.

(56) References Cited

U.S. PATENT DOCUMENTS

| | | | |
|---|---|---|---|
| 4,923,822 A | 5/1990 | Wang et al. | |
| 6,127,249 A | 10/2000 | Hu | |
| 6,130,132 A | 10/2000 | Hsieh et al. | |
| 6,281,102 B1 | 8/2001 | Cao et al. | |
| 6,329,276 B1 * | 12/2001 | Ku et al. ............... | 438/586 |
| 6,410,427 B1 | 6/2002 | Hu | |
| 6,441,429 B1 | 8/2002 | Hsieh et al. | |
| 6,573,172 B1 | 6/2003 | En et al. | |
| 6,844,258 B1 | 1/2005 | Fair et al. | |
| 6,890,808 B2 | 5/2005 | Chidambarrao et al. | |
| 2003/0040158 A1 | 2/2003 | Saitoh | |

(Continued)

FOREIGN PATENT DOCUMENTS

CN   1770425   5/2006

OTHER PUBLICATIONS

A. Tarraf et al., "Stress Investigation of PECVD Dielectric Layers for Advanced Optical MEMS," J. Micromech. Microeng., 2004, pp. 317-323, vol. 14.

*Primary Examiner*—Dung A. Le
(74) *Attorney, Agent, or Firm*—Scully, Scott, Murphy & Presser, P.C.; Lisa U. Jaklitsch, Esq.

(57) ABSTRACT

The present invention provides a method of fabricating semiconductor device comprising at least one field effect transistor (FET) having source and drain (S/D) metal silicide layers with intrinsic tensile or compressive stress. First, a metal layer containing a silicide metal M is formed over S/D regions of a FET, followed by a first annealing step to form S/D metal silicide layers that comprise a metal silicide of a first phase ($MSi_x$). A silicon nitride layer is then formed over the FET, followed by a second annealing step. During the second annealing step, the metal silicide is converted from the first phase ($MSi_x$) into a second phase ($MSi_y$) with x<y. The metal silicide conversion causes either volumetric shrinkage or expansion in the S/D metal silicide layers of the FET, which in turn generates intrinsic tensile or compressive stress in the S/D metal silicide layers under confinement by the silicon nitride layer.

18 Claims, 10 Drawing Sheets

U.S. PATENT DOCUMENTS

| | | |
|---|---|---|
| 2004/0029323 A1* | 2/2004 | Shimizu et al. ............. 438/142 |
| 2004/0251479 A1 | 12/2004 | Tsutsui et al. |
| 2004/0262784 A1 | 12/2004 | Doris et al. |
| 2005/0093030 A1 | 5/2005 | Doris et al. |
| 2005/0093059 A1 | 5/2005 | Belyansky et al. |
| 2005/0116360 A1 | 6/2005 | Huang et al. |
| 2005/0136606 A1 | 6/2005 | Rulke et al. |
| 2005/0199958 A1 | 9/2005 | Chen et al. |
| 2005/0282325 A1 | 12/2005 | Belyansky et al. |
| 2006/0091471 A1* | 5/2006 | Frohberg et al. ............ 257/369 |
| 2007/0018252 A1 | 1/2007 | Zhu |

* cited by examiner

METHODS FOR FORMING CMOS DEVICES WITH INTRINSICALLY STRESSED METAL SILICIDE LAYERS

FIELD OF THE INVENTION

This invention relates to semiconductor devices containing high performance complementary metal oxide semiconductor (CMOS) devices, such as field effect transistors (FETs). More specifically, the present invention relates to CMOS devices containing at least one high performance FET with intrinsically stressed source and drain metal silicide layers, as well as to methods for forming such an n-FET using a silicon nitride cap.

BACKGROUND OF THE INVENTION

As the complementary metal oxide semiconductor (CMOS) devices scale down, it becomes more critical to control stress, surface roughness, and defects in metal silicide layers, due to the increased impact of these factors on CMOS device performance and product yield.

Meanwhile, carrier (i.e., either electron or hole) mobility reduces with the sizes of the CMOS devices, which results in unsatisfactory device performance. The reduction in carrier mobility is caused by increased dopant concentration in the channel regions of the scaled-down CMOS devices. However, higher dopant concentration is necessary for reducing short channel effects in the scaled-down CMOS devices.

There is therefore a need for improving the carrier mobility in the channel regions of CMOS devices without reducing dopant concentration thereat.

There is further a need for reducing defects, sheet resistance, and surface roughness of the metal silicide layers contained by the CMOS devices.

SUMMARY OF THE INVENTION

The present invention advantageously employs silicon nitride cap layers to selectively confine FET devices during metal silicide phase conversion, i.e., when the metal silicide contained by the metal silicide layers in the FET is converted from a first, metal rich phase to a second, silicon rich phase. Because the metal silicide material contained by the metal silicide layers in the FET devices undergoes volumetric shrinkage or expansion during the phase conversion, desired tensile or compressive stress can be generated in the confined FET devices for enhancing electron or hole mobility therein. More importantly, such tensile or compressive stress is intrinsic to the metal silicide layers of the FET devices and remains even after the confinement is removed from the FET devices (i.e., removing the silicon nitride cap layers).

In one aspect, the present invention relates to a method for forming a semiconductor device comprising:
  forming at least one field effect transistor (FET) comprising a source region and a drain region;
  forming a metal layer over the source and drain regions of the at least one FET, wherein the metal layer comprises a silicide metal M capable of reacting with silicon to form an intrinsically stressed metal silicide;
  conducting a first annealing step to form source and drain metal silicide layers respectively in the source and drain regions of the at least one FET, wherein the source and drain metal silicide layers comprise a metal silicide of a first phase ($MSi_x$);
  forming a silicon nitride layer over the at least one FET; and
  conducting a second annealing step to convert the metal silicide from the first phase ($MSi_x$) into a second phase ($MSi_y$), wherein x<y, and wherein the metal silicide phase conversion generates intrinsic tensile or compressive stress in the source and drain metal silicide layers of the at least one FET.

The term "intrinsically stressed" or "intrinsic stress" as used herein refers to intrinsic stress, either compressive or tensile, that is developed in metal silicide layer(s) during preparation of such layer(s), rather than extrinsic stress applied to such layer(s) by an external force after preparation of such layer(s).

The silicon nitride cap layers may be essentially stress-free. In this manner, the tensile or compressive stress in the confined FET devices is solely generated by phase-conversion-induced volumetric shrinkage or expansion of the metal silicide. Alternatively, the silicon nitride cap layers may contain intrinsic tensile or compressive stress, which leads to generation of additional tensile or compressive stress in the confined FET devices beyond that generated by phase-conversion-induced volumetric shrinkage or expansion.

In a specific embodiment of the present invention, the FET is an n-channel FET (n-FET). Correspondingly, the metal layer preferably comprises cobalt, so that intrinsic tensile stress is generated in the source and drain metal silicide layers of the n-FET by the metal silicide phase conversion.

In an alternative embodiment of the present invention, the FET is a p-channel FET (p-FET). Correspondingly, the metal layer preferably comprises palladium, so that intrinsic compressive stress is generated in the source and drain metal silicide layers of the p-FET by the metal silicide phase conversion.

When an additional FET complementary to the existing FET is present and when the same metal layer is deposited over the additional, complementary FET for silicidation of the additional, complementary FET, it is important to ensure that no silicon nitride cap layer is present over the additional, complementary FET, so that no stress is generated in the additional, complementary FET during the metal silicide phase conversion.

After the second annealing step, the silicon nitride layer can either be removed from or retained in the FET, followed by deposition of an interlevel dielectric layer and formation of source, drain, and gate contacts.

In another aspect, the present invention relates to method for forming a semiconductor device comprising:
  forming at least one n-channel field effect transistor (n-FET) and at least one p-channel field effect transistor (p-FET), each comprising a source region and a drain region;
  forming a first metal layer to selectively cover the n-FET, wherein the first metal layer comprises a first silicide metal $M_1$ capable of reacting with silicon to form a tensilely stressed metal silicide;
  forming a second metal layer to selectively cover the p-FET, wherein the second metal layer comprises a second silicide metal $M_2$ capable of reacting with silicon to form a compressively stressed metal silicide;
  conducting a first annealing step to form source and drain metal silicide layers respectively in the source and drain regions of the n-FET and the p-FET, wherein the source and drain metal silicide layers of the n-FET comprise a first metal silicide of a first phase ($M_1Si_x$), and wherein the source and drain metal silicide layers of the p-FET comprise a second metal silicide of a first phase ($M_2Si_a$);
  forming one or more silicon nitride layers over the n-FET and the p-FET; and conducting a second annealing step to convert the first metal silicide in the n-FET from the first phase ($M_1Si_x$) into a second phase ($M_1Si_y$) with x<y and to convert the second metal silicide in the p-FET from the first phase ($M_2Si_a$) to a second phase ($M_2Si_b$) with a<b, wherein said phase conversion generates intrinsic tensile stress in the source and drain metal silicide layers of the n-FET and intrinsic compressive stress in the source and drain metal silicide layers of the p-FET.

Preferably, a silicon nitride layer that is free to intrinsic stress covers both the n-FET and the p-FET. Alternatively, a tensilely stressed silicon nitride layer selectively covers the n-FET, and/or a compressively stressed silicon nitride layer selectively covers the p-FET.

In a preferred, but not necessary, embodiment of the present invention, the first silicide metal is cobalt (which undergoes volumetric shrinkage to create tensile stress when silicidated), and the second silicide metal is palladium (which undergoes volumetric expansion to create compressive stress when silicidated).

In a further aspect, the present invention relates to a semiconductor device comprising at least one field effect transistor (FET) having source and drain regions that each contains a metal silicide layer with intrinsic tensile or compressive stress, wherein the semiconductor device is devoid of any silicon nitride layer.

For a specific example, the semiconductor device of the present invention comprises an n-channel FET (n-FET) having source and drain regions that each contains a metal silicide layer with intrinsic tensile stress. Alternatively, the semiconductor device comprises a p-channel FET (p-FET) having source and drain regions that each contains a metal silicide layer with intrinsic compressive stress.

Other aspects, features and advantages of the invention will be more fully apparent from the ensuing disclosure and appended claims.

DETAILED DESCRIPTION OF THE INVENTION, AND PREFERRED EMBODIMENTS THEREOF

Figure 1:
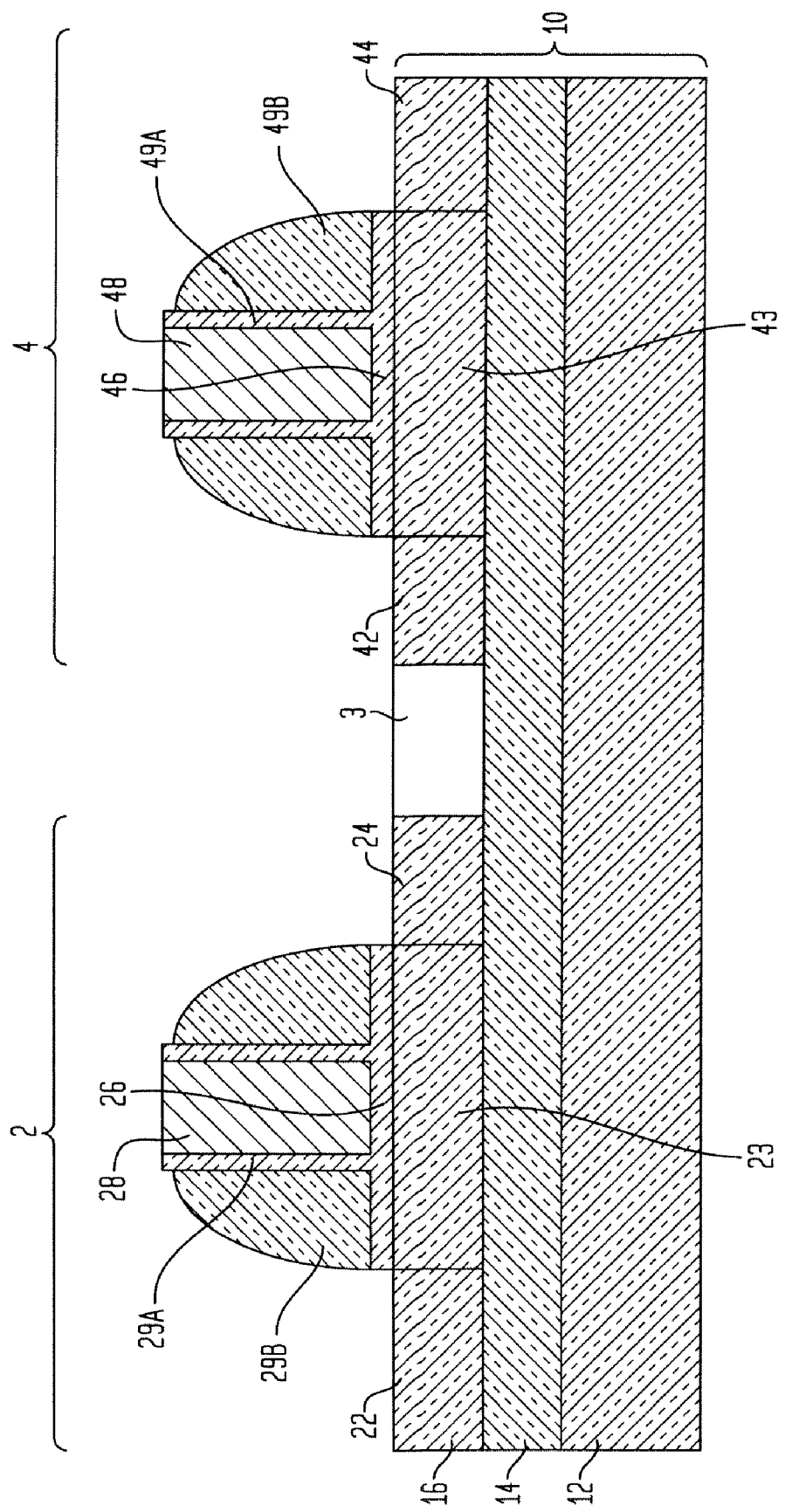
FIGS. 1-6 are cross sectional views that illustrate exemplary processing steps for forming a semiconductor device that comprises an n-FET having source and drain metal silicide layers with intrinsic tensile stress and a p-FET having stress-free source and drain metal silicide layers, according to one embodiment of the present invention.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As mentioned hereinabove, the present invention uses silicon nitride cap layers to selectively confine FET devices when the source/drain metal silicide of the FET devices is converted from a first, metal rich phase to a second, silicon rich phase. Depending on the specific silicide metal used, the phase conversion may cause either volumetric shrinkage or volumetric expansion in the metal silicide layers of the confined FET devices. Consequently, desired intrinsic tensile or compressive stress can be generated in the metal silicide layers of the confined FET device and remains therein even after the confinement is removed. Therefore, the resulting source/drain metal silicide layers can be used for applying the desired tensile or compressive stress to the channel regions of the FET devices for enhancing electron or hole mobility therein, without any additional stress-inducing structural layers.

The intrinsically stressed source/drain metal silicide layers, as described hereinabove, are formed by a salicidation process containing two annealing steps, the first of which forms a metal silicide in a relatively metal-rich phase, and the second of which convert the metal silicide from the relatively metal-rich phase to a relatively silicon-rich phase. Confinement by the silicon nitride cap layer is provided only during the second annealing step, not the first annealing step. It is essential to confine the silicide to realize significantly higher tensile or compressive stress due to the fact that stress from volumetric change is not otherwise released from exposed silicide surface.

In addition to the use of silicon nitride cap layer for confining the FETs, it is also discovered by the inventors of the present invention that the surface roughness of the source/drain metal silicide layers can be readily modulated by a stressed silicon nitride cap layer during the phase conversion of metal silicide.

Further, stressed silicon nitride cap layer can be used to apply additional stress (either tensile or compressive) to the FET during the metal silicide phase conversion, thereby creating more tensile or compressive stress in the metal silicide layers after the phase conversion. Furthermore, the intrinsic nitride stress increases after being exposed to high temperature anneal.

When complementary FETs are located on the same substrate as the FETs to be processed, it is important to ensure that either no silicon nitride cap layers are present over the complementary FET devices during the second annealing step when the phase conversion occurs, so that no undesired stress is generated in the complementary FETs.

Alternatively, different types of silicide metal can be used in the complementary FET devices, so that opposite stress can be generated in the complementary FET devices during the second annealing step when the complementary FET devices are confined by silicide nitride cap layers.

FIGS. 1-6 are cross sectional views that illustrate exemplary processing steps for forming a semiconductor device that comprises an n-FET having source and drain metal silicide layers with intrinsic tensile stress and a p-FET having stress-free source and drain metal silicide layers, according to one embodiment of the present invention. Note that in these drawings, which are not drawn to scale, like and/or corresponding elements are referred to by like reference numerals. It is further noted that in the drawings only one n-FET and one p-FET are shown atop a single semiconductor substrate. Although illustration is made to such an embodiment, the present invention is not limited to the formation of any specific number of FET devices on the surface of the semiconductor structure.

Reference is first made to FIG. 1, which shows a cross-sectional view of a semiconductor device containing an n-FET 2 and a p-FET 4. Both n-FET 2 and p-FET 4 comprise source regions 22 and 42, channel regions 23 and 43, drain regions 24 and 44, gate dielectrics 26 and 46, gate conductors 28 and 48, and sidewall spacers 29A-B and 49A-B. More specifically, the source/channel/drain regions 22, 23, 24, 42, 43, and 44 are all located in a semiconductor substrate 10, which is preferably, but not necessarily, a semiconductor-on-insulator (SOI) structure having a base substrate layer 12, a buried insulator layer 14, and a semiconductor device layer 16.

The semiconductor substrate 10 may comprise any semiconductor material including, but not limited to: Si, SiC, SiGe, SiGeC, Ge alloys, GaAs, InAs, InP, as well as other III-V or II-VI compound semiconductors. Semiconductor substrate 10 may also comprise an organic semiconductor or a layered semiconductor, such as Si/SiGe or a semiconductor-on-insulator (SOI) as shown in FIG. 1. In some embodiments of the present invention, it is preferred that the semiconductor substrate 10 be composed of a Si-containing semiconductor material, i.e., a semiconductor material that includes silicon. The semiconductor substrate 10 may be doped, undoped or contain doped and undoped regions therein.

At least one isolation region 3 is typically formed into the semiconductor substrate 10 to provide isolation between the n-FET and p-FET 2 and 4. The isolation region 3 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The depth of such a trench isolation may vary and is not critical to the present invention. The field oxide may be formed utilizing a so-called local oxidation of silicon process.

The gate dielectric layers 26 and 46 of the n-FET 2 and the p-FET are comprised of an insulating material including, but not limited to: an oxide, nitride, oxynitride and/or silicate including metal silicates and nitrided metal silicates. In one embodiment, it is preferred that the gate dielectric layers 26 and 46 are comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the gate dielectric layers 26 and 46 may vary, but typically, the gate dielectric layer has a thickness from about 0.5 to about 10 nm, with a thickness from about 0.5 to about 3 nm being more typical.

The gate conductors 28 and 48 may comprise any conductive material(s) suitable for formation of FET gate conductors. Preferably, but not necessarily, the gate conductors 28 and 48 comprise silicon-containing conductive materials, such as doped polysilicon materials.

The gate dielectric layers 26 and 46 and the gate conductors 28 and 48 form respective gate stacks for the n-FET 2 and the p-FET 4, which may comprise additional structure layers, e.g., cap layers and/or diffusion barrier layers, as commonly included in the CMOS gate structures.

A reoxidation process can optionally, but not necessarily, be performed to create a conformal silicon oxide sidewall layer (not shown) over the patterned polysilicon gate stacks as mentioned hereinabove. Next, a conformal silicon nitride layer (not shown) is deposited over the entire structure. The conformal silicon dioxide sidewall layer and the silicon nitride layer can then be patterned to form sidewall oxide spacers 29A and 49A and sidewall nitride spacers 29B and 49B along exposed sidewalls of the n-FET and p-FET gate stacks.

After formation of the sidewall oxide spacers 29A and 49A and sidewall nitride spacers 29B and 49B, n-doped source and drain regions 22 and 24 and p-doped source and drain regions 42 and 44 are formed into the semiconductor device layer 16 by dopant implantation followed by annealing. The conditions for the ion implantation and the annealing step are well known to those skilled in the art and are therefore not described in detail herein. Channel regions 23 and 43 are correspondingly defined by the doped source and drain regions 22, 24, 42, and 44.

Figure 2:
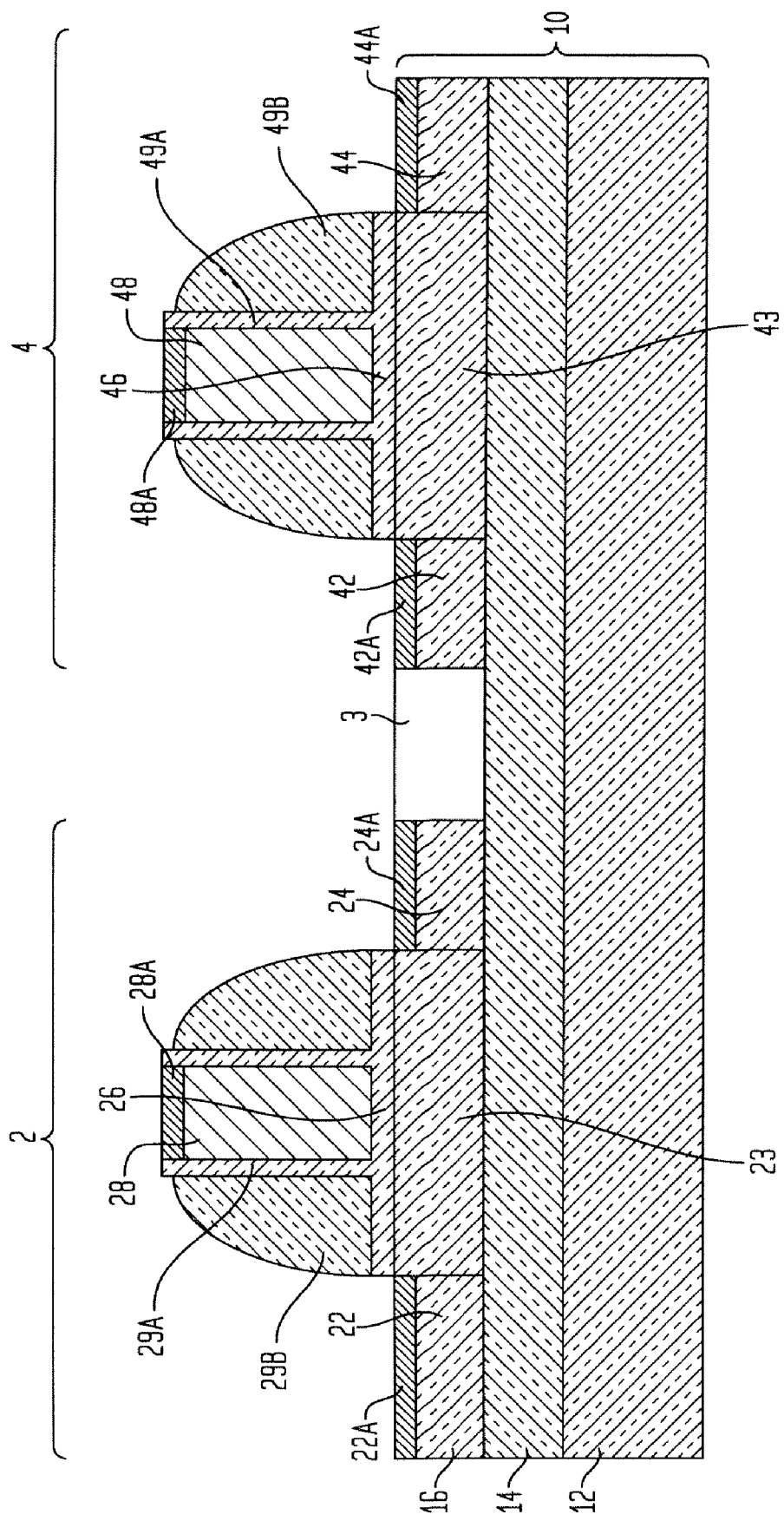

Next, a metal layer (not shown) can be deposited over the entire structure of FIG. 1, followed by a first annealing step to form source/drain metal silicide layers 22A and 24A and a gate metal silicide layer 28A for the n-FET 2 and source/drain metal silicide layers 42A and 44A and a gate metal silicide layer 48A for the p-FET 4, as shown in FIG. 2. It is noted that when the semiconductor device layer 16 does not include silicon, a patterned silicon layer (not shown) can be formed selectively over the n-FET source/drain/gate 22, 24, and 28 and the p-FET source/drain/gate 42, 44, and 48, prior to deposition of the metal layer. Further, although the gates 28 and 48 of the n-FET 2 and the p-FET 4 are silicidated in the specific embodiments described hereinafter, it is important to note that the n-FET and p-FET gates 28 and 48 do not have to be subject to silicidation, depending on the specific application requirements. In certain embodiments, the n-FET and p-FET gates 28 and 48 are covered by dielectric caps before deposition of the metal layer and are therefore protected from subsequent silicidation.

The metal layer may comprise any metal or metal alloy that is capable of reacting with silicon to form a tensilely stressed metal silicide. In a preferred embodiment, the metal layer contains either pure cobalt or a cobalt alloy. The metal layer may be deposited using any conventional deposition process including, for example, sputtering, chemical vapor deposition, evaporation, chemical solution deposition, atomic layer deposition (ALD), plating and the like. Preferably, the metal layer has a thickness ranging from about 1 nm to about 50 nm, more preferably from about 2 nm to about 20 nm, and most preferably from about 5 nm to about 15 nm.

A first annealing step is then carried out to form metal silicide layers 22A, 24A, 28A, 42A, 44A, and 48A in the source/drain/gate regions 22, 24, 28, 42, 44, and 48 of the n-FET 2 and p-FET 4, as shown in FIG. 2. The first annealing step is typically performed in a gas atmosphere, e.g., He, Ar, $N_2$ or forming gas at relatively low temperatures ranging from about 300° C. to about 600° C., preferably from about 350° C. to about 550° C., by using a continuous heating regime or various ramp and soak heating cycles. Preferably, but not necessarily, the first annealing step is conducted using known rapid thermal annealing (RTA) techniques.

The metal silicide layers 22A, 24A, 28A, 42A, 44A, and 48A formed by the first annealing step contain a metal silicide at a first, relatively metal-rich phase ($MSi_x$), which is capable of being subsequently converted into a second, relatively silicon-rich phase ($MSi_y$) with x<y. Since the n-FET 2 and p-FET 4 are not confined in any manner during the first annealing step, little or no stress is generated in the metal silicide layers 22A, 24A, 28A, 42A, 44A, and 48A.

Figure 3:
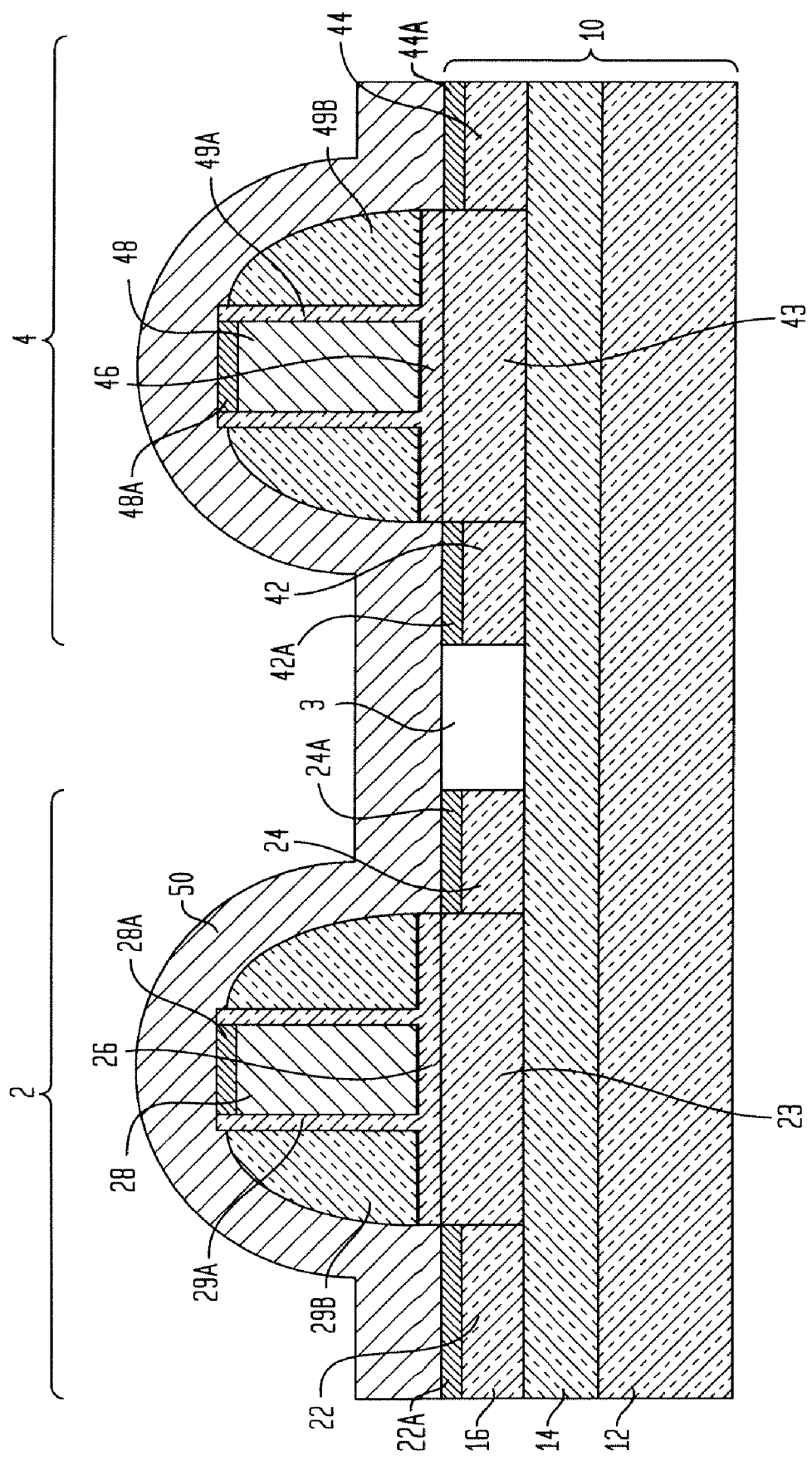

Next, a blanket silicon nitride layer 50 is deposited over both the n-FET 2 and the p-FET 4, as shown in FIG. 3. The blanket silicon nitride layer 50 can be readily formed by, for example, a low pressure chemical vapor deposition (LPCVD) process or a plasma enhanced chemical vapor deposition (PECVD) process, as disclosed by U.S. Patent Application Publication No. 2003/0040158 or by A. Tarraf et al., "Stress Investigation of PECVD Dielectric Layers for Advanced Optical MEMS," J. MICROMECH. MICROENG., Vol. 14, pp. 317-323 (2004), or by any other suitable deposition techniques well known in the art. The blanket silicon nitride layer 50 may be stress-free, or it may contain intrinsic tensile stress. The physical thickness of the blanket silicon nitride layer 50 typically ranges from about 10 nm to about 500 nm, more typically from about 20 nm to about 200 nm, and most typically from about 40 nm to about 100 nm.

Figure 4:
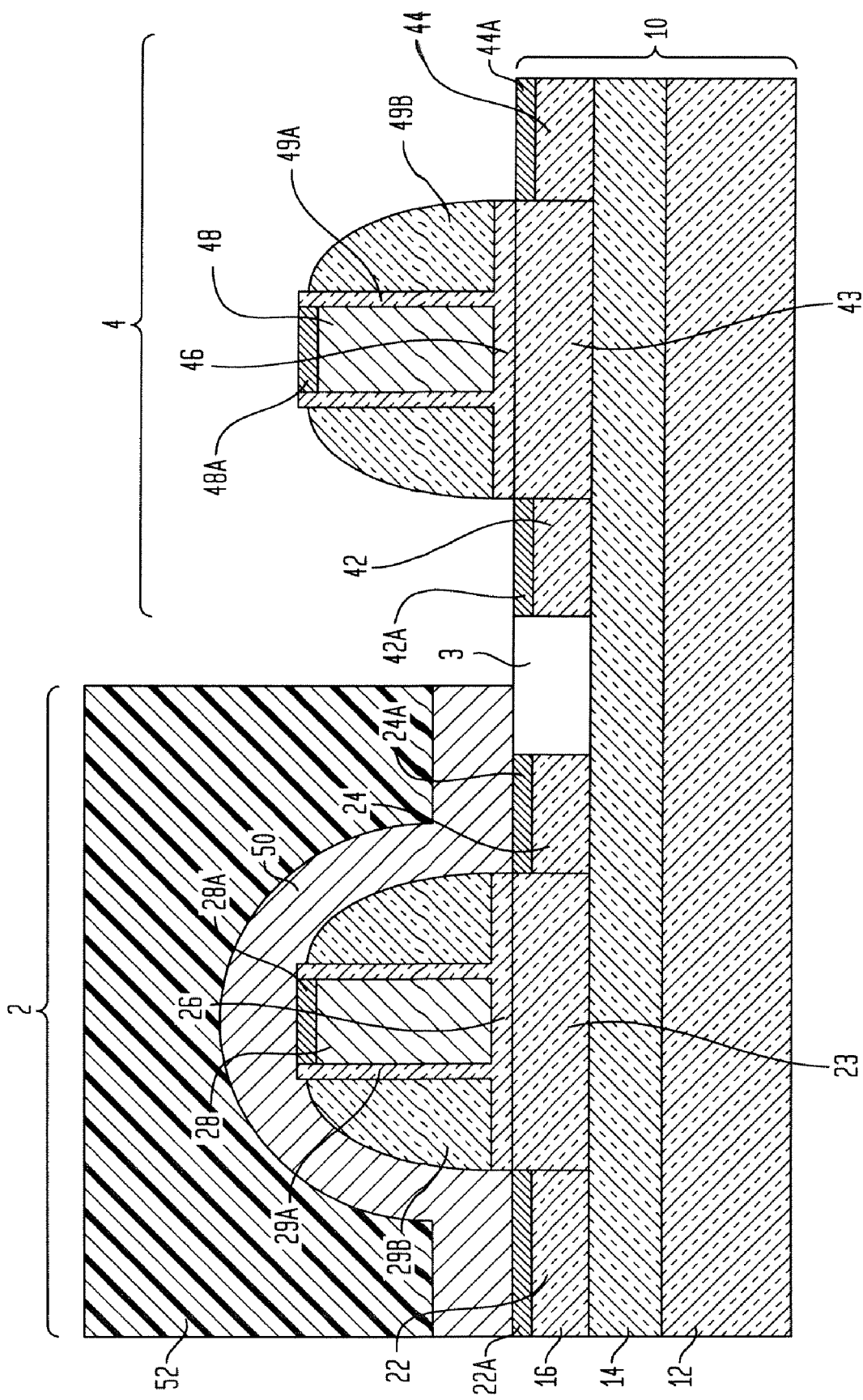

Subsequently, a patterned photoresist film 52 is formed to selectively cover the n-FET 2. The patterned photoresist film 52 is used as a mask for selectively removal of a portions of the blanket silicon nitride layer 50 by an etching step, preferably by a dry etching process such as reactive ion etching (RIE), thereby exposing upper surfaces of the metal silicide layers 42A, 44A, and 48A in the p-FET 4, as shown in FIG. 4. The patterned photoresist film 52 can be removed from the n-FET 2 by know resist-stripping techniques after etching.

Figure 5:
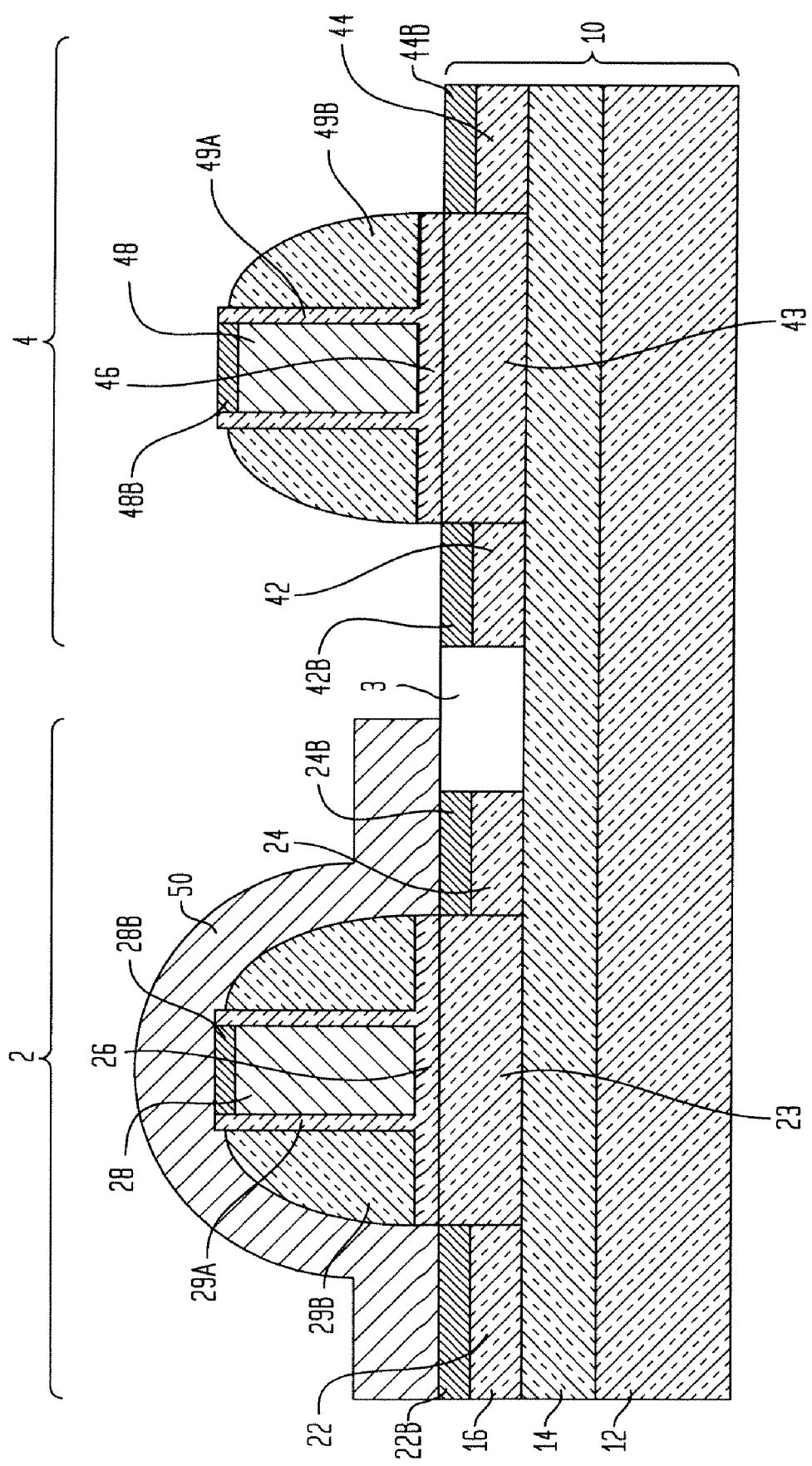

A second annealing step is then carried out in a gas atmosphere, e.g., He, Ar, $N_2$ or forming gas at relatively high temperatures (in comparison with the first annealing step) ranging from about 400° C. to about 800° C., preferably from about 650° C. to about 750° C., by using a continuous heating regime or various ramp and soak heating cycles. Preferably, but not necessarily, the second annealing step is also conducted using known rapid thermal annealing (RTA) techniques. The second high temperature annealing step converts the metal silicide layers 22A, 24A, 28A, 42A, 44A, and 48A of the n-FET 2 and p-FET 4, which contain a metal silicide at a relatively metal-rich phase ($MSi_x$), into metal silicide layers 22B, 24B, 28B, 42B, 44B, and 48B that contain the metal silicide at a relatively silicon-rich phase ($MSi_y$, where x<y), as shown in FIG. 5.

During the second annealing step, the n-FET 2 is covered and confined by the silicon nitride layer 50, and intrinsic tensile stress is thereby generated in the metal silicide layers 22B, 24B, and 28B in the n-FET 2 due to volumetric shrinkage of the metal silicide when it is converted from the relatively metal rich phase ($MSi_x$) into the relatively silicon-rich phase ($MSi_y$, where x<y). In contrast, the p-FET 4 is not covered or confined in any manner, so little or no intrinsic stress is generated in the metal silicide layers 42B, 44B, and 48B in the p-FET 4.

Further, if the silicon nitride layer 50 used for confining the n-FET 2 contains intrinsic tensile stress, additional intrinsic tensile stress beyond that generated by volumetric shrinkage can be formed in the metal silicide layers 22B, 24B, and 28B in the n-FET 2, because the metal silicide layers 22B, 24B, and 28B can preserve or "memorize" the stress contained in the silicon nitride layer 50. Therefore, in a preferred, but not necessary, embodiment of the present invention, the silicon nitride layer 50 that is selectively formed over the n-FET 2 contains intrinsic tensile stress.

Figure 6:
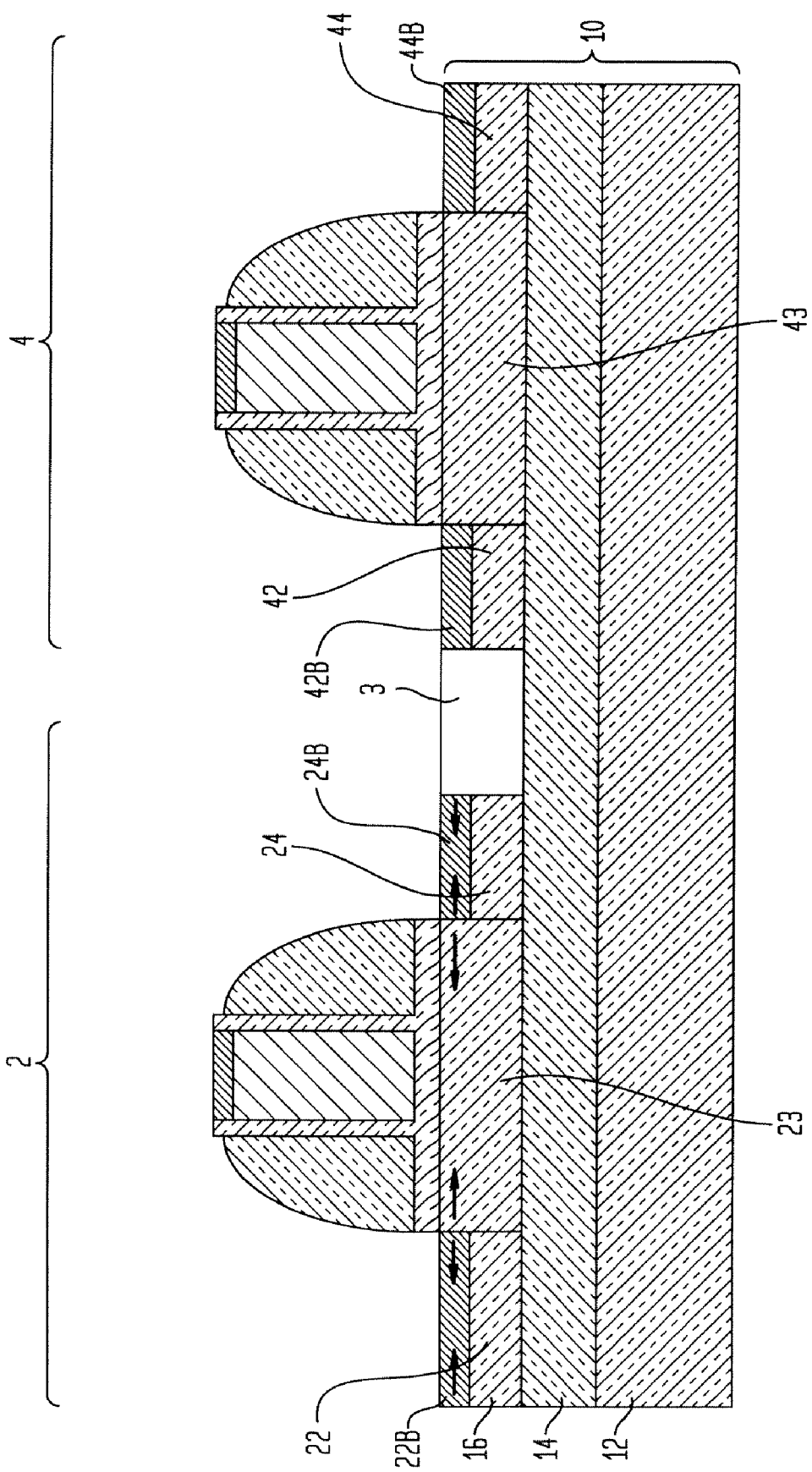

The intrinsic tensile stress generated in the metal silicide layers 22B, 24B, and 28B of the n-FET 2 during the second annealing step remains therein even after the confinement (i.e., the silicon nitride layer 50) is removed from the n-FET 2. Consequently, a CMOS device structure that is devoid of any silicon nitride layer, but contains an n-FET 2 with tensilely stressed source/drain metal silicide layers 22B and 24B is formed, while the tensilely stressed source/drain metal silicide layers 22B and 24B apply desired tensile stress to the channel region 23 of the n-FET 2 for enhancing electron mobility therein, as shown in FIG. 6.

It is also important to note that the selective removal of silicon nitride from the p-FET 4 as shown in FIG. 4 causes significant damages (which in turn leads to significant resistance increase) in the metal silicide of the relatively metal-rich phase ($MSi_x$) as contained by the metal silicide layers 42A, 44A, and 48A in the p-FET 4, while the second annealing step functions to recover the damaged metal silicide and reduce the sheet resistance of the metal silicide layers during the conversion thereof from the relatively metal-rich phase ($MSi_x$) to the relatively silicon-rich phase ($MSi_y$). Correspondingly, silicide sheet resistance is reduced from about 11 ohm/square to about 8.7 ohm/square (a 20% improvement) due to the removal of silicide defects.

In an alterative embodiment of the present invention, the field effect transistor 2 can be a p-FET, while the filed effect transistor 4 can be an n-FET. Correspondingly, it is preferred that the metal layer used to form metal silicide in the p-FET 2 and the n-FET 4 comprises a metal or metal alloy that is capable of reacting with silicon to form a compressively stressed metal silicide. For example, the metal layer may comprise either pure palladium or a palladium alloy that undergoes volumetric expansion when silicidated. In this manner, during the second annealing step, the p-FET 2 is covered and confined by the silicon nitride layer 50, and intrinsic compressive stress is thereby generated in the metal silicide layers 22B, 24B, and 28B in the p-FET 2 due to volumetric expansion of the metal silicide when it is converted from the relatively metal rich phase ($MSi_x$) into the relatively silicon-rich phase ($MSi_y$, where x<y). In contrast, the n-FET 4 is not covered or confined in any manner, so little or no intrinsic stress is generated in the metal silicide layers 42B, 44B, and 48B in the n-FET 4.

In another specific embodiment of the present invention, different silicide metals are used for silicidation of the n-FET and the p-FET. For example, cobalt or a cobalt alloy can be used for silicidation of the n-FET, and palladium or a palladium alloy can be used for silicidation of the p-FET. In this manner, both the n-FET and p-FET can both be confined during the second annealing step, so that intrinsic tensile stress can be generated in the n-FET due to volumetric shrinkage of the cobalt silicide when it is converted from a metal-rich phase to a silicon-rich phase, while intrinsic compressive stress can be generated in the p-FET due to volumetric expansion of the palladium silicide when converted from a metal-rich phase to a silicon-rich phase. Confinement of the n-FET and p-FET with different silicide metals can be either achieved by either a single silicon nitride layer that is stress-free, or by two different silicon nitride layers, one of which comprises tensile stress and selectively covers the n-FET, and the other of which comprises compressive stress and selectively covers the p-FET.

Figure 7:
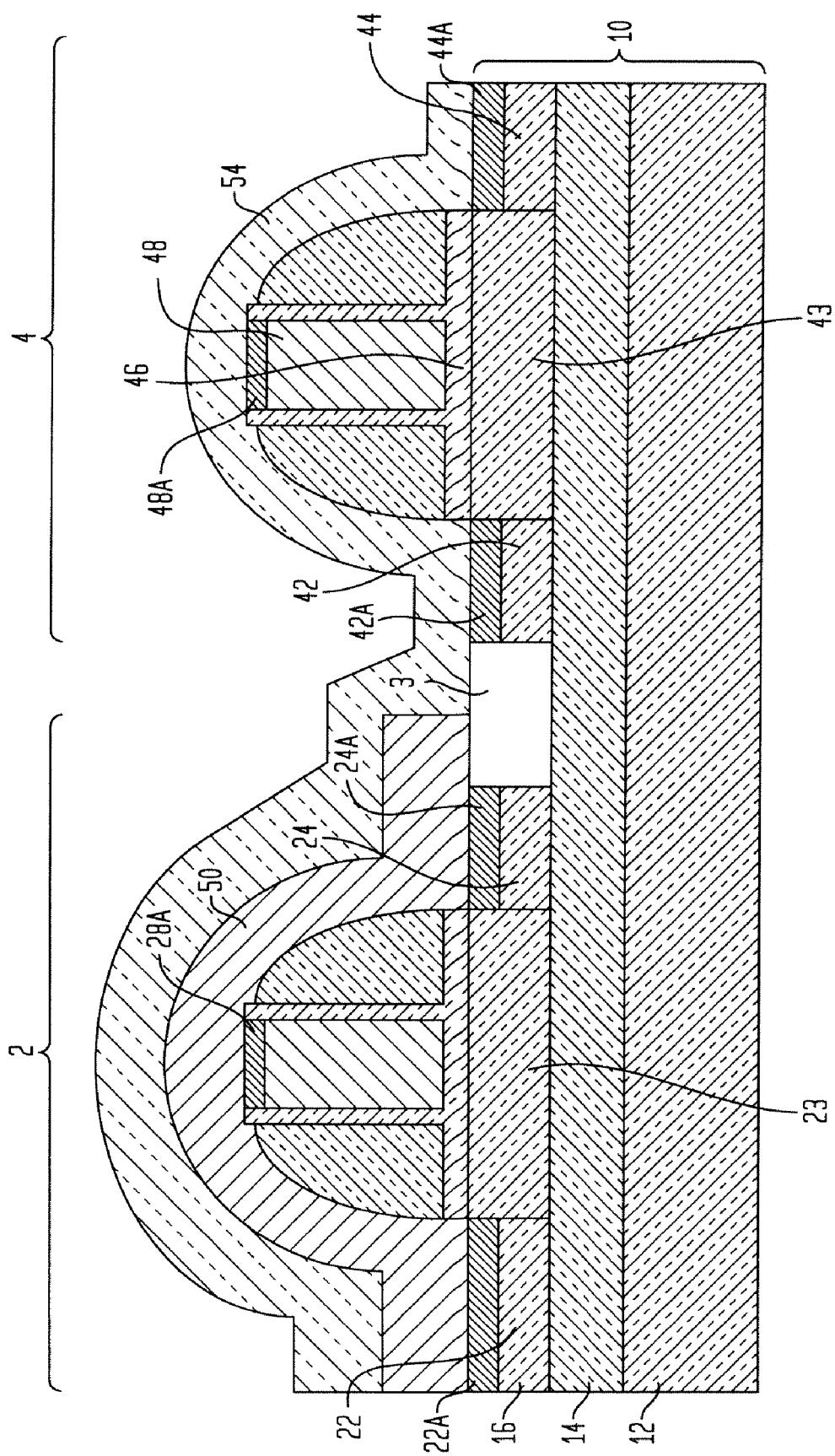
FIGS. 7-10 are cross-sectional views that illustrate exemplary processing steps for forming a semiconductor device that comprises an n-FET having source and drain metal silicide layers with intrinsic tensile stress and a p-FET having source and drain metal silicide layers with intrinsic compressive stress, according to one embodiment of the present invention.

Specifically, FIG. 7 shows an n-FET 2 and a p-FET 4 containing different metal silicides in their source, drain, and gate regions 22A, 24A, 28A, 42A, 44A, and 48A after the first annealing step and after formation of a first patterned silicon nitride layer 50 over the n-FET2 but before the second annealing step. The first patterned silicon nitride layer 50 comprises tensile stress. A second blanket silicon nitride layer 54 is then deposited over both the n-FET 2 and the p-FET 4. Such a second blanket silicon nitride layer 54 preferably contains intrinsic compressive stress. The silicon nitride layer 54 can be formed by, for example, a plasma enhanced chemical vapor deposition (PECVD) process, as disclosed by U.S. Patent Application Publication No. 2003/0040158 or by A. Tarraf et al., "Stress Investigation of PECVD Dielectric Layers for Advanced Optical MEMS," J. MICROMECH. MICROENG., Vol. 14, pp. 317-323 (2004), or by any other suitable deposition technique well known in the art such as high density plasma (HDP) deposition. Preferably, the silicon nitride layer 54 has a thickness ranging from about 10 nm to about 500 nm, more preferably from about 20 nm to about 200 nm, and most preferably from about 30 nm to about 150 nm.

Figure 8:
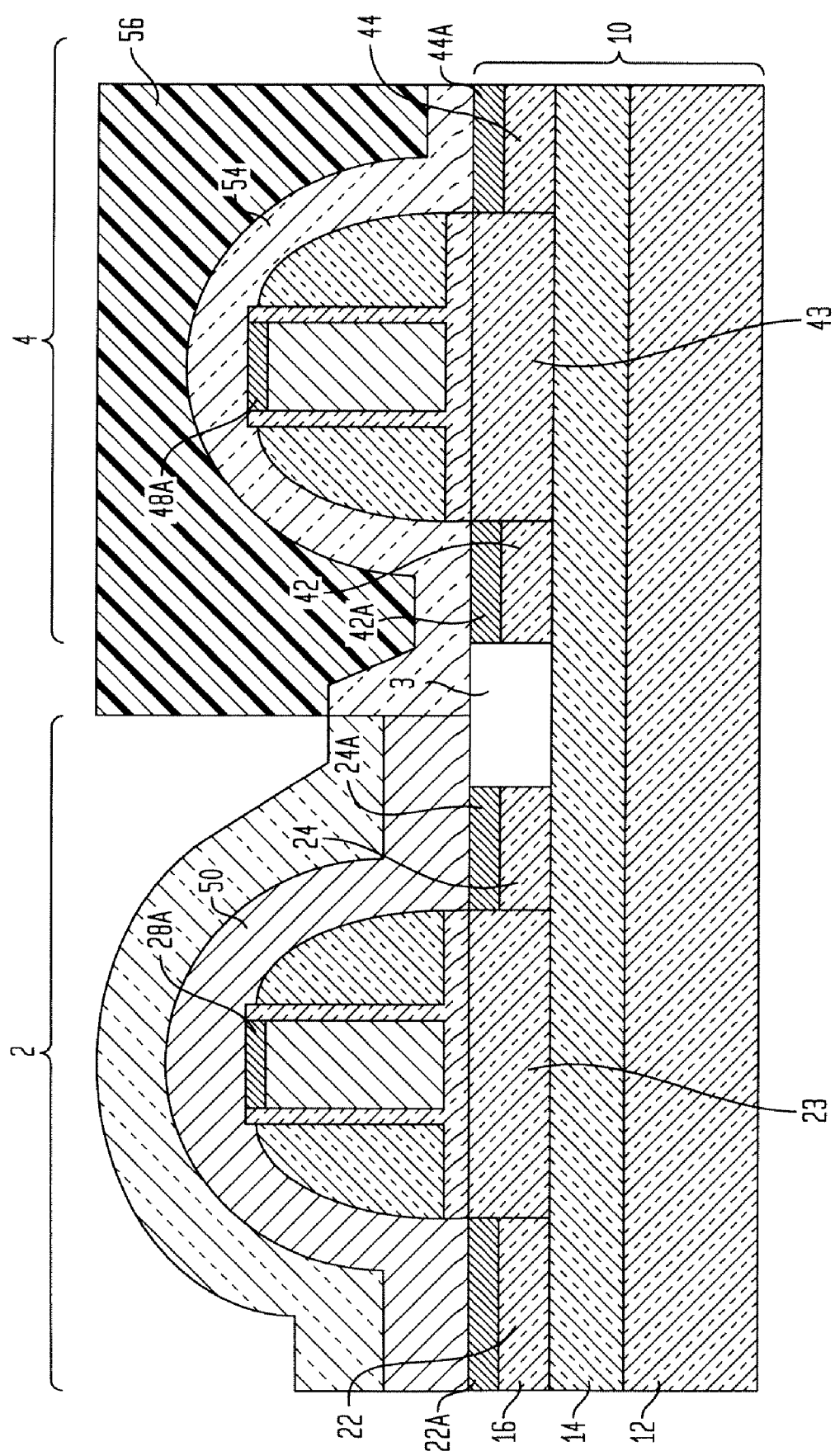

Subsequently, a second patterned photoresist film 56 is formed to selectively cover the p-FET 4. The patterned photoresist film 56 is used as a mask for selectively removal of a portions of the second blanket silicon nitride layer 54 by an etching step, preferably by a dry etching process such as reactive ion etching (RIE), thereby exposing an upper surfaces of the first silicon nitride layer 50 located over the n-FET 2, as shown in FIG. 8. The patterned photoresist film 56 can be removed from the p-FET 4 by know resist-stripping techniques after etching.

Figure 9:
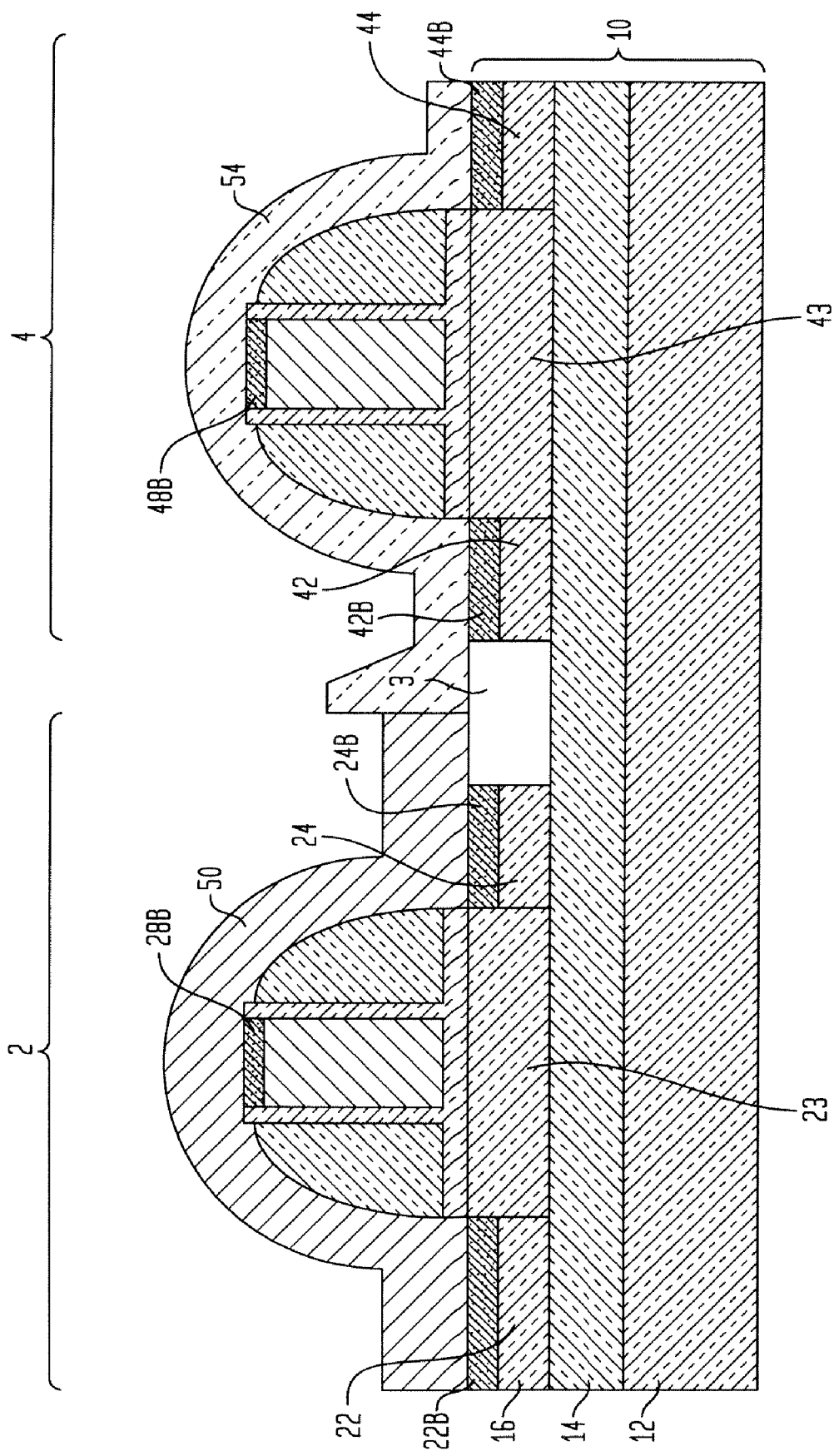

The second annealing step, as described hereinabove, is then carried out to convert the metal silicide layers 22A, 24A, 28A, 42A, 44A, and 48A of the n-FET 2 and p-FET 4 that respectively contain cobalt silicide and palladium silicide at relatively metal-rich phases into metal silicide layers 22B, 24B, 28B, 42B, 44B, and 48B that contain the cobalt silicide and the palladium silicide at a relatively silicon-rich phase, as shown in FIG. 9.

During the second annealing step, the n-FET 2 is covered and confined by the silicon nitride layer 50, and intrinsic tensile stress is thereby generated in the metal silicide layers 22B, 24B, and 28B in the n-FET 2 due to volumetric shrinkage of the cobalt silicide when it is converted from the relatively metal rich phase into the relatively silicon-rich phase. When the silicon nitride layer 50 contains intrinsic tensile stress, additional tensile stress can be generated in the metal silicide layers 22B, 24B, and 28B in the n-FET 2 beyond that generated by volumetric shrinkage of cobalt silicide.

In contrast, the p-FET 4 is covered and confined by the silicon nitride layer 54 during the second annealing step, and intrinsic compressive stress is thereby generated in the metal silicide layers 42B, 44B, and 48B in the p-FET 4 due to volumetric expansion of the palladium silicide when it is converted from the relatively metal rich phase into the relatively silicon-rich phase. When the silicon nitride layer 54 contains intrinsic compressive stress, additional compressive stress can be generated in the metal silicide layers 42B, 44B, and 48B in the p-FET 4 beyond that generated by volumetric expansion of palladium silicide.

The intrinsic tensile stress generated in the metal silicide layers 22B, 24B, and 28B of the n-FET 2 and the intrinsic compressive stress generated in the metal silicide layers 42B, 44B, and 48B of the p-FET 4 during the second annealing step remain therein even after the confinements (i.e., the silicon nitride layers 50 and 54) are removed from the n-FET 2 and the p-FET 4.

Figure 10:
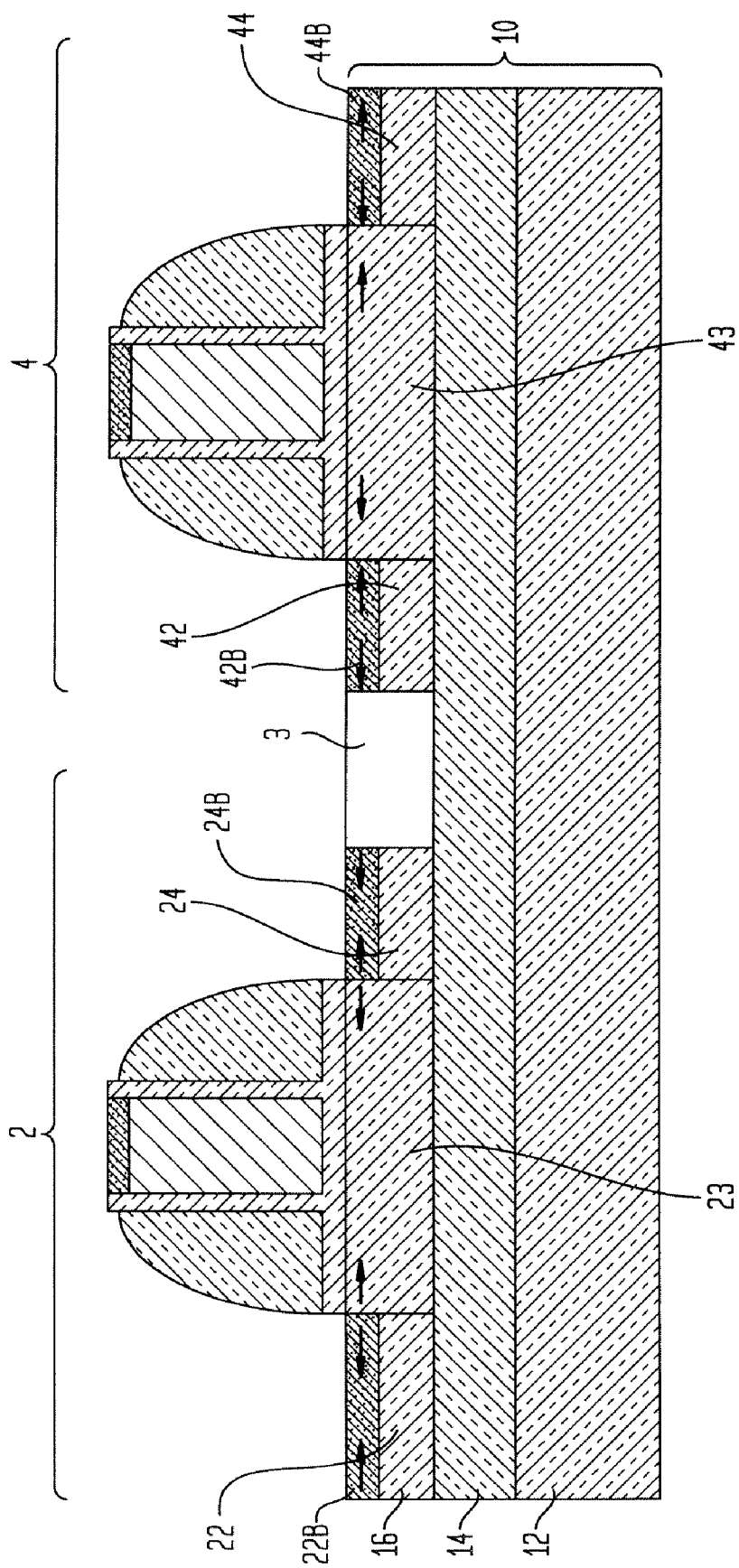

Consequently, a CMOS device structure that is devoid of any silicon nitride layer but contains an n-FET 2 with tensilely stressed source/drain metal silicide layers 22B and 24B and a p-FET with compressively stressed source/drain metal silicide layers 42B and 44B is formed. The tensilely stressed source/drain metal silicide layers 22B and 24B apply desired tensile stress to the channel region 23 of the n-FET 2 for enhancing electron mobility therein, and the compressively stressed source/drain metal silicide layers 42B and 44B apply desired compressive stress to the channel region 43 of the p-FET 4 for enhancing hole mobility therein, as shown in FIG. 10.

Subsequently, conventional back-end-of-line processing steps, which are not described herein in detail, can be carried out to form a complete semiconductor device containing both the n-FET 2 and the p-FET 4.

It should be noted that although the above-described processing steps illustrate formation of the tensilely stressed silicon layer before the compressively stressed silicon nitride layer, the present invention is not limited to such a specific order. In other words, the compressively stressed silicon layer can be readily formed before deposition of the tensilely stressed silicon layer in the practice of the present invention.

Further, although the above-described FET structures do not include raised source/drain regions, the present invention also contemplates the presence of raised source/drain regions in the FET structures. The raised source/drain regions are formed utilizing conventional techniques well known to those skilled in the art. Specifically, the raised source/drain regions are formed by depositing any Si-containing layer, such as epitaxial Si, amorphous Si, SiGe, and the like, atop the semiconductor substrate 10 prior to implanting.

The methods of the present invention can be widely used for fabricating various semiconductor device structures, including, but not limited to, complementary metal-oxide-semiconductor (CMOS) transistors, as well as integrated circuit, microprocessors and other electronic devices comprising such CMOS transistors, which are well known to those skilled in the art and can be readily modified to incorporate the strained semiconductor-on-insulator structure of the present invention, and therefore details concerning their fabrication are not provided herein.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method for forming a semiconductor device comprising:
   forming at least one field effect transistor (FET) comprising a source region and a drain region;
   forming a metal layer over the source and drain regions of the at least one FET, wherein the metal layer comprises a silicide metal M capable of reacting with silicon to form an intrinsically stressed metal silicide;
   conducting a first annealing step to form source and drain metal silicide layers respectively in the source and drain regions of the at least one FET, wherein the source and drain metal silicide layers comprise a metal silicide of a first phase ($MSi_x$);
   forming a silicon nitride layer over the at least one FET;
   conducting a second annealing step to convert the metal silicide from the first phase ($MSi_x$) into a second phase ($MSi_y$), wherein x<y, and wherein the metal suicide phase conversion generates intrinsic tensile or compressive stress in the source and drain metal silicide layers of the at least one FET; and
   removing the deposited silicon nitride layer from the at least one FET, followed by deposition of an interlevel dielectric layer and formation of source, drain, and gate contacts.

2. The method of claim 1, wherein the deposited silicon nitride layer is free of intrinsic stress.

3. The method of claim 1, wherein the FET is an n-channel FET (n-FET), wherein the metal layer. comprises cobalt, and wherein intrinsic tensile stress is generated in the source and drain metal suicide layers of the n-FET by the metal silicide phase conversion.

4. The method of claim 3, wherein the deposited silicon nitride layer comprises intrinsic tensile stress.

5. The method of claim 1, wherein the FET is a p-channel FET (p-FET), wherein the metal layer comprises palladium, and wherein intrinsic compressive stress is generated in the source and drain metal silicide layers of the FET by the metal silicide phase conversion.

6. The method of claim 5, wherein the deposited silicon nitride layer comprises intrinsic compressive stress.

7. The method of claim 1, wherein the deposited silicon nitride layer is retained in a region including an n-FET after the second annealing step, followed by deposition of said interlevel dielectric layer and formation of said source, drain, and gate contacts.

8. The method of claim 1, wherein the first annealing is conducted at a first annealing temperature ranging from about 300° C. to about 600° C., and wherein the second annealing is conducted at a second annealing temperature ranging from about 400° C. to about 800° C.

9. The method of claim 1, wherein an additional FET is formed, which also comprises a source region and a drain region and is complementary to said at least one FET, wherein the metal layer is deposited over the source and drain regions of both the at least one FET and the additional FET, and wherein the silicon nitride layer is selectively formed over the at least one FET, but not over the additional FET, so that the metal silicide phase conversion generates no stress in the source and drain regions of the additional FET.

10. A method for forming a semiconductor device comprising:
forming at least one n-channel field effect transistor (n-FET) and at least one p-channel field effect transistor (p-FET), each comprising a source region and a drain region;
forming a first metal layer to selectively cover the n-FET, wherein the first metal layer comprises a first silicide metal $M_1$ capable of reacting with silicon to form a tensilely stressed metal suicide;
forming a second metal layer to selectively cover the p-FET, wherein the second metal layer comprises a second suicide metal $M_2$ capable of reacting with silicon to form a compressively stressed metal silicide;
conducting a first annealing step to form source and drain metal silicide layers respectively in the source and drain regions of the n-FET and the p-FET, wherein the source and drain metal suicide layers of the n-FET comprise a first metal silicide of a first phase ($M_1Si_x$), and wherein the source and drain metal suicide layers of the p-FET comprise a second metal suicide of a first phase ($M_2Si_a$);
forming one or more silicon nitride layers over the n-FET and the p-FET; and
conducting a second annealing step to convert the first metal silicide in the n-FET from the first phase ($M_1Si_x$) into a second phase ($M_1Si_y$) with x<y and to convert the second metal silicide in the p-FET from the first phase ($M_2Si_a$) to a second phase ($M_2Si_b$) with a<b, wherein said phase conversion generates intrinsic tensile stress in the source and drain metal silicide layers of the n-FET and intrinsic compressive stress in the source and drain metal silicide layers of the p-FET.

11. The method of claim 10, wherein the one or more silicon nitride layers comprises a silicon nitride layer that is free of intrinsic stress and covers both the n-FET and the p-FET.

12. The method of claim 10, wherein the one or more silicon nitride layers comprises a tensilely stressed silicon nitride layer that selectively covers the n-FET.

13. The method of claim 10, wherein the one or more silicon nitride layers comprises a compressively stressed silicon nitride layer that selectively covers the p-FET.

14. The method of claim 10, wherein the first silicide metal is cobalt, and wherein the second silicide metal is palladium.

15. The method of claim 10, further comprising removing the one or more silicon nitride layers from the n-FET and p-FET after the second annealing step, followed by deposition of an interlevel dielectric layer over both the n-FET and the p-FET and formation of source, drain, and gate contacts for the n-FET and the p-FET.

16. The method of claim 10, wherein the one or more silicon nitride layers are retained over the n-FET and p-FET after the second annealing step, followed by deposition of an interlevel dielectric layer over both the n-FET and the p-FET and formation of source, drain, and gate contacts for the n-FET and the p-FET.

17. A method for forming a semiconductor device comprising:
forming at least one p-channel field effect transistor (p-FET) comprising a source region and a drain region;
forming a metal layer over the source and drain regions of the at least one pFET, wherein the metal layer comprises palladium Pd which is capable of reacting with silicon to form an intrinsically compressive stressed palladium suicide;
conducting a first annealing step to form source and drain metal silicide layers respectively in the source and drain regions of the at least one FET, wherein the source and drain metal silicide layers comprise a metal silicide of a first phase ($PdSi_x$);
forming a silicon nitride layer over the at least one pFET; and
conducting a second annealing step to convert the metal suicide from the first phase ($PdSi_x$) into a second phase ($PdSi_y$), wherein x<y, and wherein the metal suicide phase conversion generates intrinsic compressive stress in the source and drain metal suicide layers of the at least one pFET.

18. A method for forming a semiconductor device comprising:
forming at least one field effect transistor (FET) comprising a source region and a drain region;
forming an additional FET which also comprises a source region and a drain region and is complementary to said at least one FET;
forming a metal layer over the source and drain regions of both the at least one FET and the additional FET, wherein the metal layer comprises a suicide metal M capable of reacting with silicon to form an intrinsically stressed metal silicide;
conducting a first annealing step to form source and drain metal suicide layers respectively in the source and drain regions of the at least one FET, wherein the source and drain metal suicide layers comprise a metal suicide of a first phase ($MSi_x$); and
forming a silicon nitride layer over the at least one FET, but not the additional FET;
conducting a second annealing step to convert the metal silicide from the first phase ($MSi_x$) into a second phase ($MSi_y$), wherein x<y, and wherein the metal silicide phase conversion generates intrinsic tensile or compressive stress in the source and drain metal silicide layers of the at least one FET, while the metal silicide phase conversion generates no stress in the source and drain regions of the additional FET.

* * * * *